(12) United States Patent
McKee (10) Patent No.: US 7,446,357 B2
(45) Date of Patent: Nov. 4, 2008

(54) SPLIT TRUNK PIXEL LAYOUT

(75) Inventor: Jeffrey A. McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 320 days.

(21) Appl. No.: 11/126,307

(22) Filed: May 11, 2005

(65) Prior Publication Data

US 2006/0267052 A1    Nov. 30, 2006

(51) Int. Cl.
*H01L 31/62* (2006.01)
*H01L 31/113* (2006.01)

(52) U.S. Cl. .................... 257/292; 257/293

(58) Field of Classification Search .............. 257/292, 257/293
See application file for complete search history.

(56) References Cited

U.S. PATENT DOCUMENTS

| | | | |
|---|---|---|---|
| 5,488,239 A | 1/1996 | Jung | |
| 5,955,753 A | 9/1999 | Takahashi | |
| 6,107,655 A | 8/2000 | Guidash | |
| 6,160,281 A | 12/2000 | Guidash | |
| 6,218,656 B1 | 4/2001 | Guidash | |
| 6,352,869 B1 | 3/2002 | Guidash | |
| 6,423,994 B1 | 7/2002 | Guidash | |
| 6,552,323 B2 | 4/2003 | Guidash et al. | |
| 6,657,665 B1 | 12/2003 | Guidash | |
| 6,947,088 B2 | 9/2005 | Kochi | |
| 2002/0121656 A1 | 9/2002 | Guidash | |
| 2004/0046104 A1 | 3/2004 | Rhodes | |
| 2005/0167574 A1 | 8/2005 | He et al. | |
| 2006/0231875 A1* | 10/2006 | Patrick et al. | ............... 257/292 |

FOREIGN PATENT DOCUMENTS

| | | |
|---|---|---|
| DE | 198 27 020 A1 | 12/1999 |
| EP | 1 091 409 A2 | 4/2001 |
| EP | 1 139 428 A2 | 10/2001 |

OTHER PUBLICATIONS

International Search Report.

* cited by examiner

*Primary Examiner*—Kiesha L Rose
(74) *Attorney, Agent, or Firm*—Dickstein Shapiro LLP (57) ABSTRACT

A pixel array architecture having multiple pixel cells arranged in a split trunk pixel layout and sharing common pixel cell components. The array architecture increases the fill factor, and in turn, the quantum efficiency of the pixel cells. The common pixel cell components may be shared by a number of pixels in the array, and may include several components that are associated with the storage and readout of a signal from the pixel cells.

56 Claims, 6 Drawing Sheets

SPLIT TRUNK PIXEL LAYOUT

FIELD OF THE INVENTION

The present invention relates generally to digital image sensors and in particular to a pixel cell array architecture have a high quantum efficiency.

BACKGROUND OF THE INVENTION

Typically, a digital imager array includes a focal plane array of pixel cells, each one of the cells including a photo sensor, e.g., a photo gate, photoconductor, or a photodiode. In a CMOS imager a readout circuit is connected to each pixel cell which typically includes a source follower output transistor. The photo sensor converts photons to electrons which are typically transferred to a storage node, e.g., a floating diffusion region connected to the gate of the source follower output transistor. A charge transfer device (e.g., transistor) can be included for transferring charge from the photo sensor to the floating diffusion region. In addition, such imager cells typically have a transistor for resetting the storage node to a predetermined charge level prior to charge transference. The output of the source follower transistor is gated as a pixel output signal by a row select transistor.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, each assigned to Micron Technology, Inc. The disclosures of each of the forgoing patents are hereby incorporated by reference in their entirety.

Figure 1:
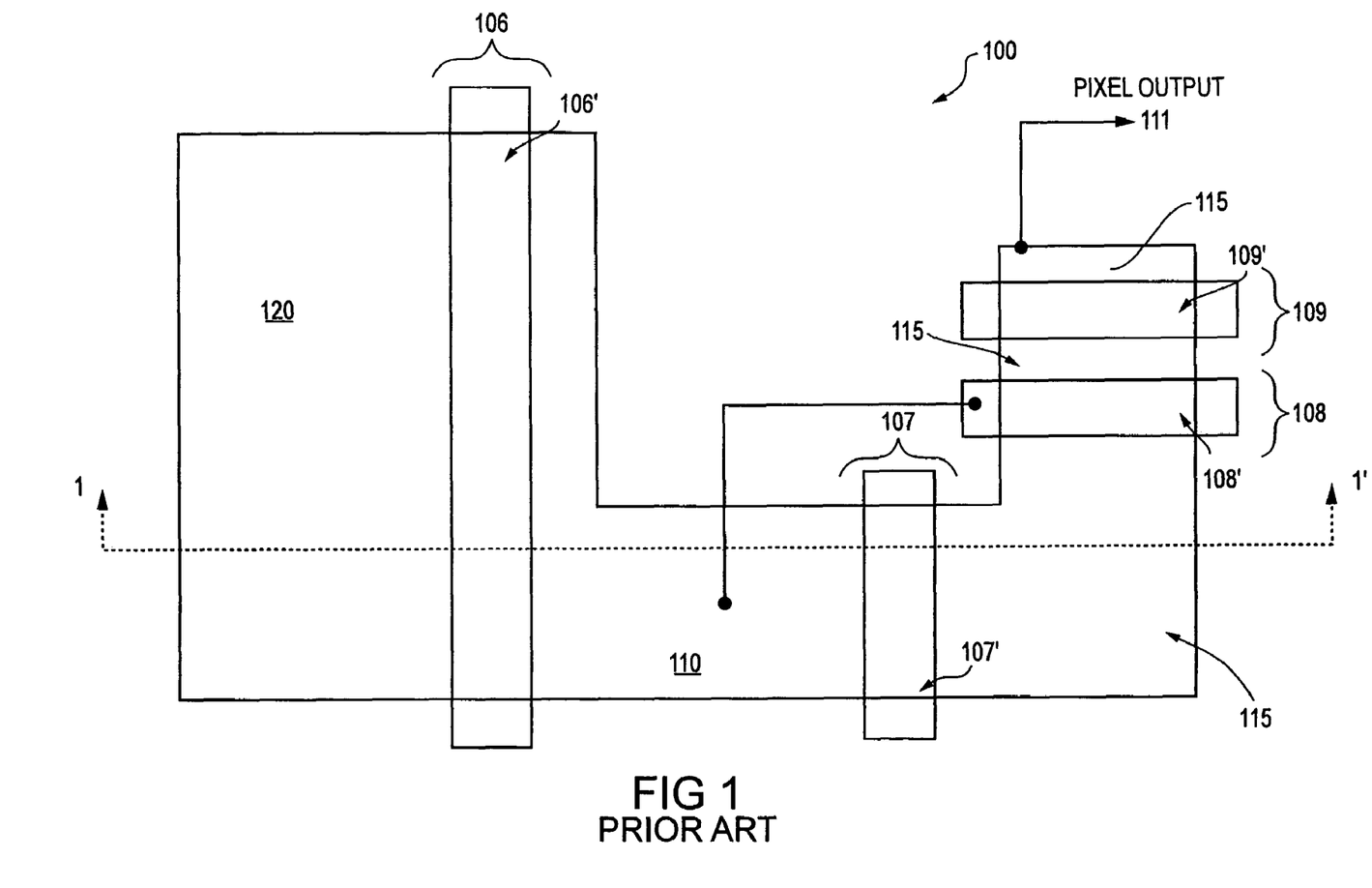
FIG. 1 is a top-down view of a conventional CMOS pixel cell.
Figure 2:
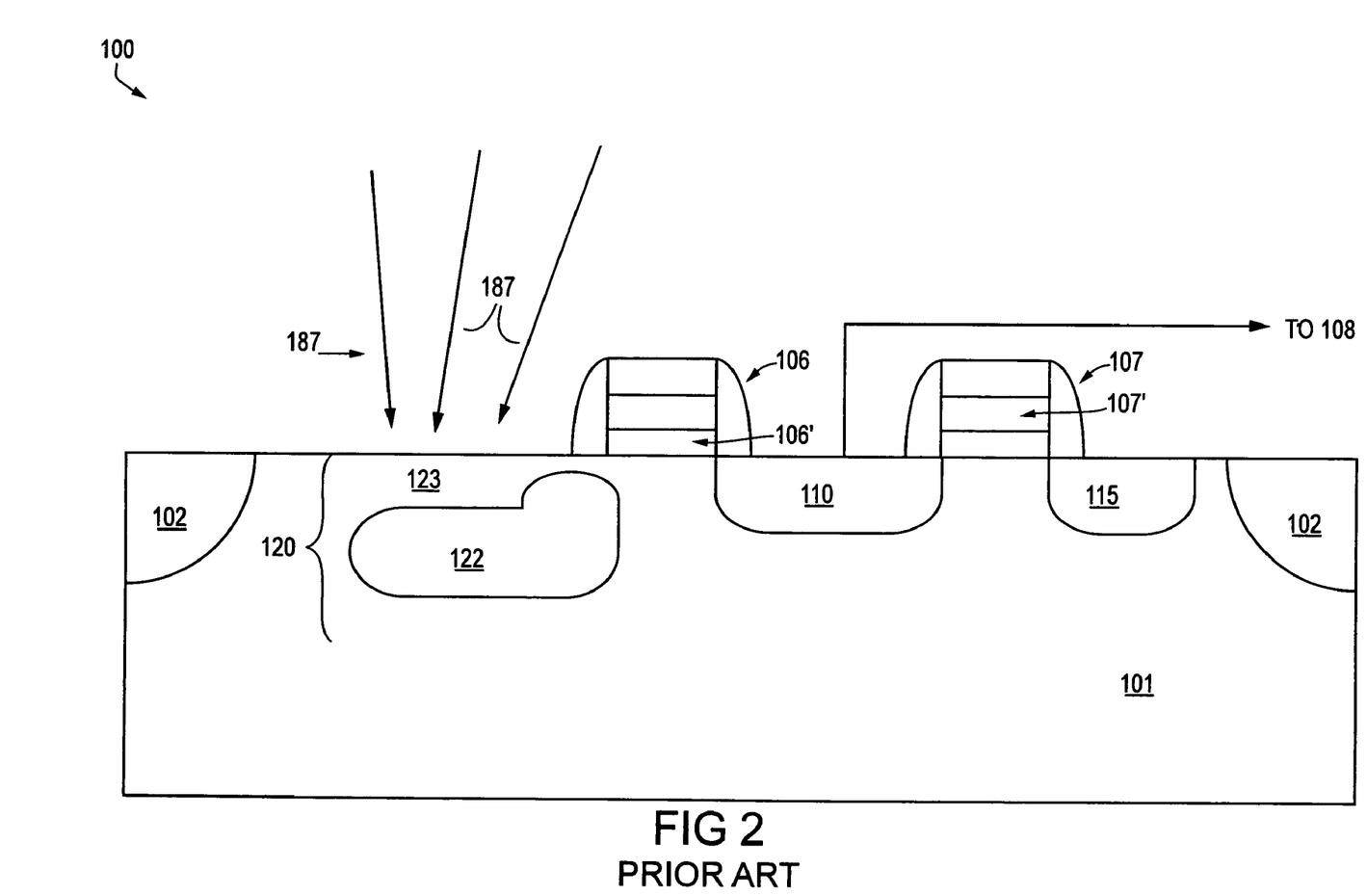
FIG. 2 is a cross-sectional view of the pixel cell of FIG. 1, taken along line 1-1'.

With reference to FIGS. 1 and 2, which respectively illustrate a top-down and a cross-sectional view of a conventional CMOS pixel cell 100, when incident light 187 strikes the surface of a photodiode photo sensor 120, electron/hole pairs are generated in the p-n junction of the photodiode photo sensor 120 (represented at the boundary of n-accumulation region 122 and p+ surface layer 123). The generated electrons (photo-charges) are collected in the n-type accumulation region 122 of the photo sensor 120. The photo-charges move from the initial charge accumulation region 122 to a floating diffusion region 110 via a transfer transistor 106. The charge at the floating diffusion region 110 is typically converted to a pixel output voltage by a source follower transistor 108 and subsequently output on a column output line 111 via a row select transistor 109.

Conventional CMOS imager designs, such as that shown in FIG. 1 for pixel cell 100, provide approximately a fifty percent fill factor, meaning only half of the cell 100 is dedicated to converting light to charge carriers. As shown, only a small portion of the cell 100 comprises a photo sensor 120 (e.g., photodiode). The remainder of the pixel cell 100 includes isolation regions 102, shown as STI regions in a substrate 101, the floating diffusion region 110 coupled to a transfer gate 106' of the transfer transistor 106, and source/drain regions 115 for reset 107, source follower 108, and row select 109 transistors having respective gates 107', 108', and 109'. In the conventional pixel cell 100 layout, each of the reset, source follower and row select transistor gates 107', 108' and 109' are aligned consecutively, sharing source/drain regions 115 and requiring significant surface area for each pixel cell 100. As desired scaling of pixels continues to decrease the pixel's 100 total area, it becomes increasingly important to create high sensitivity photo sensors that utilize a minimum amount of surface area, or to find more efficient pixel cell layouts to minimize the area required by non-photosensitive components of the pixel cell in order to maintain relatively large areas for the photo sensors.

In addition, conventional storage nodes, such as floating diffusion region 110, have a limited amount of charge storage capacity. Once this capacity is reached, a pixel cell becomes less efficient. Once the charge storage capacity is exceeded, an undesirable phenomenon, known as "blooming" occurs, whereby the "over-capacity" charges escape to undesirable parts of the pixel cell 100 or to adjacent pixel cells. One suggested solution for dealing with this limited charge storage capacity is to add a capacitor which is connected to the floating diffusion region 110. The capacitor is used to store the additional over-capacity charges so the charges do not flow to other areas of the cell or adjacent cells. The problem with this solution, however, is that the additional capacitor takes up space in the cell that could otherwise be used to increase the size of the cell's photo sensor, thereby decreasing the potential fill factor for the pixel cells and overall array.

Accordingly, there is a need and desire for a more efficient pixel cell array architecture that has an improved fill factor and charge storage capacity.

BRIEF SUMMARY OF THE INVENTION

The present invention, as illustrated in the various exemplary embodiments, provides a pixel cell array architecture having multiple pixel cells arranged in a split trunk pixel layout and sharing common pixel cell components. The pixel cell and array architecture increases the fill factor, and in turn, the quantum efficiency of the pixel cell array. The common pixel cell components are shared by a number of pixel cells in the array, and may include several components that are associated with the readout of a signal from the pixel cells. The split trunk layout may provide a transfer transistor and a reset transistor, separated by a floating diffusion region, on one trunk, and a source follower transistor and row select transistor on a separate trunk. Each trunk has a respective active device area.

In accordance with exemplary embodiments of the invention, the pixel cell architecture includes a shared transfer gate floating diffusion region and a reset gate for multiple pixels, located on a first trunk, which is separated from a shared row select and source follower transistor on a second trunk. In yet other exemplary embodiments, the source follower transistor gate is part of a bottom electrode for a capacitor.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, epitaxial, silicon-on-insulator (SOI) or silicon-on-sapphire (SOS) technology, doped and undoes semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photo sensor and associated transistors for converting photons to an electrical signal. For purposes of illustration, representative pixel cells are described; however, the invention is not limited to pixel cells having the representative component parts. Accordingly, the following detailed description is not to be taken in a limiting sense, and the scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when a portion of an object and some reference point meet to form an angle that is not 0°, 90°, or 180°, the object is considered "angled," "at an angle," or "slanted" with respect to the reference point.

Figure 3:
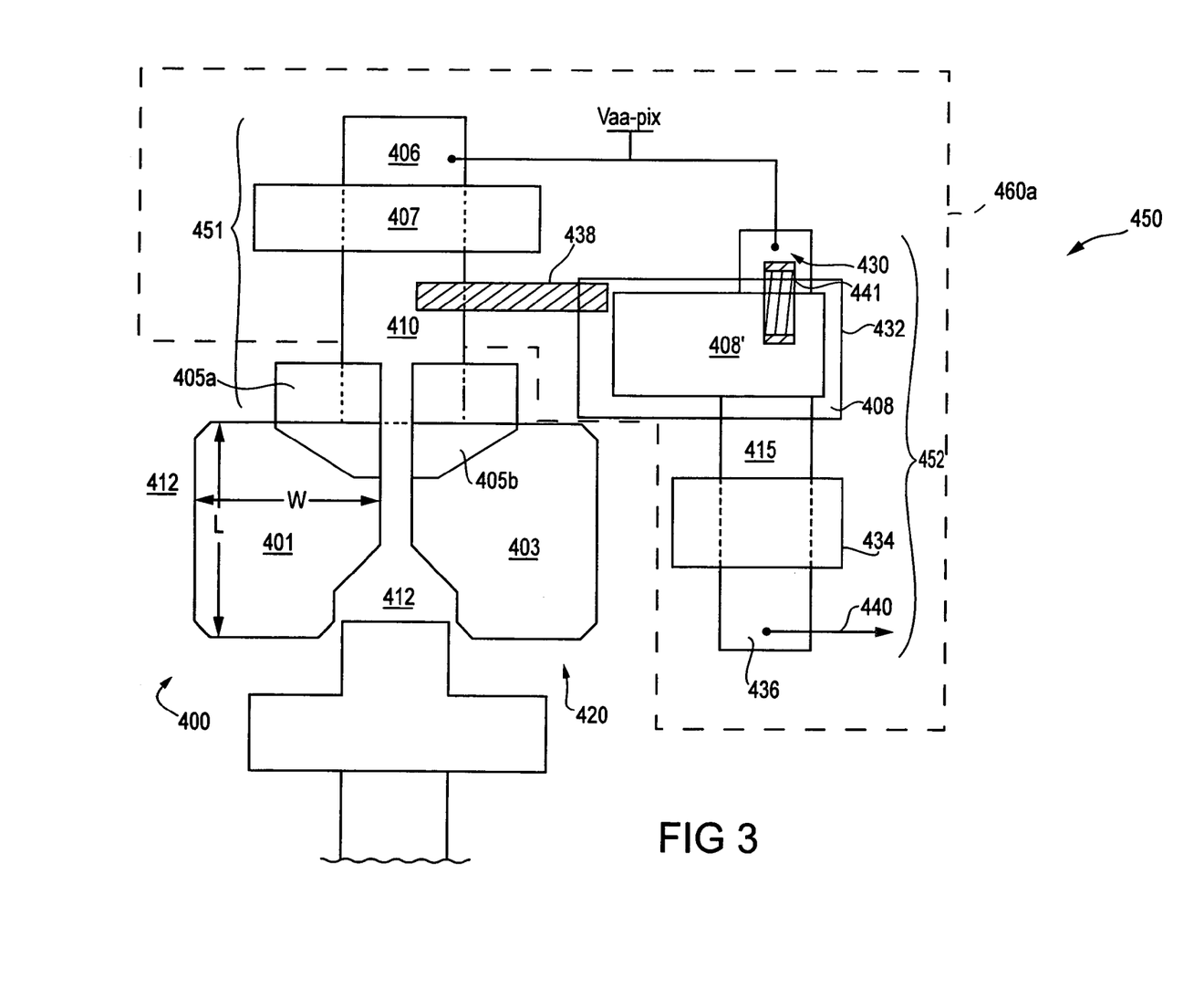
FIG. 3 is a top-down view of a portion of a CMOS pixel cell array constructed in accordance with an exemplary embodiment of the invention.
Figure 4:
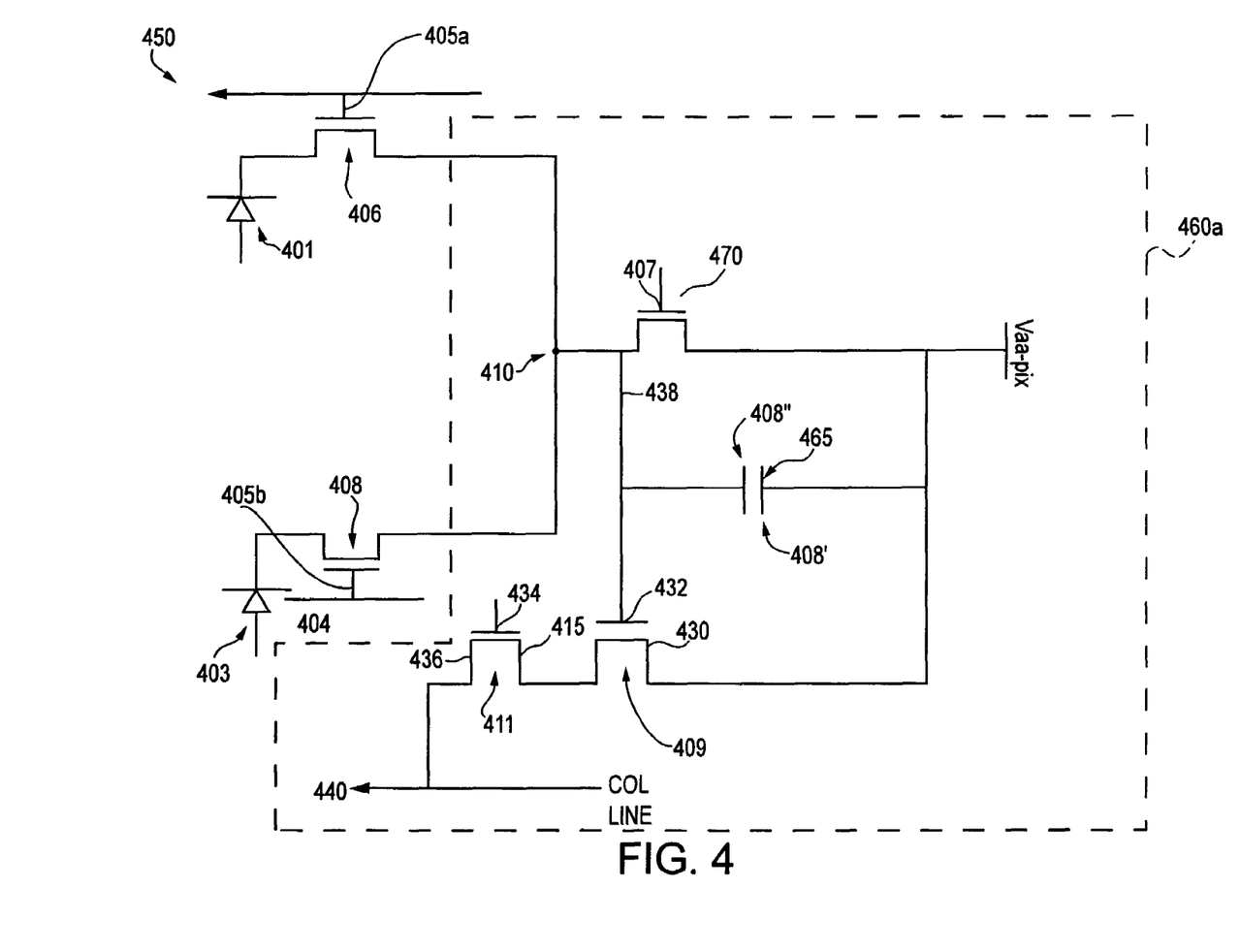
FIG. 4 is a circuit diagram of the portion of the exemplary pixel cell array shown in FIG. 3.

Turning to the Figures, where like numerals represent like elements, a first embodiment of the invention will now be described in connection with FIGS. 3 and 4. FIG. 3 is a top-down view of a substrate having a layout in accordance with a first embodiment of the invention. FIG. 4 shows the electrical circuit for the FIG. 3 embodiment.

In FIGS. 3 and 4, two row adjacent pixels 400, 420 form a portion of an exemplary pixel array. The dotted line designated as 460 represents a common shared pixel structure, which is shared by two pixels 400, 420, each formed by the common structure 460 and one of the photo sensors, e.g. photodiodes, 401 and 403, respectively. The common shared architecture illustrated in 460 includes a split trunk pixel design. A first of the split trunks 451 has a respective active device region and is designated by a pair of transfer transistors respectively associated with each of the photo sensors 401 and 403 and having respective transfer transistor gates 405a, 405b. The first split trunk 451 also has a common floating diffusion region 410, a gate 407 of a reset transistor 470, and a source/drain region 406, also associated with the reset transistor 470, which in practice is connected to a supply voltage, designated in FIG. 3 as $V_{aa-pix}$. The other portion of the split trunk 452, which also has a respective active area, includes a source/drain region 430, connectable to the supply voltage $V_{aa-pix}$, a source follower transistor gate 432, a source/drain region 415, a gate 434 for a row select transistor and another source/drain region 436 which forms a column output for the shared pixels 400, 420.

In the structures illustrated in FIG. 3, the gate 432 of the source follower transistor is also one electrode 408" of a capacitor, the other electrode of which is designated as 408'. A conductor 438 is shown in FIG. 3 as interconnecting the floating diffusion region 410 and the gate electrode 432 of the source follower transistor 409. Although shown in FIG. 3 as a buried conductor, that is a conductor close to the surface of the substrate, conductor 438 could also be implemented through upper layer metallization levels, which are well known in the art. An additional buried conductor 441 is illustrated as interconnecting the electrode 408" of the capacitor 408 with the source/drain region 430, which is in turn connected to the supply voltage $V_{aa-pix}$.

FIG. 3 illustrates two pixels 400, 420 sharing common structure embraced by the dotted line 460. Each pixel has a respective photo sensor associated therewith 401, 403. Thus, one pixel 400 is formed by the photo sensor 401 and common structure 460, and the other pixel 420 is formed by the photo sensor 403 and the common structure 460. An isolation region 412 isolates the two adjacent photo sensors 401, 403.

The pixel architectures depicted in the embodiment illustrated in FIGS. 3, 4 are replicated many times in a pixel array both horizontally and vertically. The advantage of a split trunk architecture for the pixel is greater flexibility in the placement of the transistor structures required for operation of the pixels. In addition, because pixels share storage and readout architecture, it is not necessary to have a separate storage and readout architecture for each pixel, thereby permitting either a more dense pixel structure or a greater area for the photo sensors 401, 403. In the illustrated embodiments, the first of the split trunk 451 active device regions is located in the area partially between and just above the photo sensors 401, 403. The second trunk 452 active region is located between the first pair of pixels 400, 420 and an adjacent second pair of pixels (not shown), residing above the pixel pair 400, 420 in FIG. 3.

In the exemplary embodiment illustrated above, at least a portion 451 of the transfer gates 405a, 405b(FIG. 3) is angled with respect to the photo sensors 401, 403. For example, with reference to FIG. 3, sides of each gate 405a, 405bare shown as being slanted with respect to the length L and the width W of the associated photo sensors 401, 403. This angled geometry of the transfer gates 405a, 405ballows for an efficient layout of the transfer gate. In addition, this angled layout is also beneficial in maximizing the fill factor of the pixel cells, by maximizing the area of the photo sensor 401, 403 for each pixel.

As noted in accordance with the invention, the shared components for the two pixel cells are arranged in a split trunk design, defined by active device regions of the two trunks 451, 452. The two active regions are electrically connected via a conductor 438 which may be formed as a buried conductor close to the surface of a substrate on which the pixels are formed or in a wiring layer above the surface of the pixel array 450, and it may electrically connect the source follower gate 432 to the floating diffusion region 410. Any suitable conductive material may be used to form the interconnect layer 417. It should be understood that other split trunk layouts are also within the scope of the invention, as the invention is not limited to the layout shown in the FIG. 3 exemplary embodiment.

In addition, in accordance with the split trunk pixel architecture, the source follower gate 432 area may be increased, which reduces the fixed-pattern noise of the pixel cells 400, 420 without decreasing the fill factor. The illustrated embodiment also permits the gate 432 to act as one electrode 408" of a shared capacitor 465, which is electrically connected between the floating diffusion region 410 and supply voltage $V_{aa\text{-}pix}$. Shared capacitor 465 can be used to increase the charge storage capacity of the floating diffusion region 410 and the quantum efficiency of the pixels 400, 420, and the dual use of the source follower transistor 409 gate 432 as capacitor electrode 408" maximizes the capacitor 465 area while minimizing loss of photo sensor area.

The shared pixel structures 460 and may be formed in a substrate using known methods of transistor fabrication to form the transistors as described herein in the embodied split trunk pixel layouts illustrated in FIG. 3. The photo sensors 401, 403 can be formed as any suitable photosensitive structure for converting light photons into electrons (photo-charges). In a preferred embodiment, the photo sensors 401, 403 are pinned photodiode regions, however, they may be formed as photo gates, Schottky diodes, or as another photo-sensing device compatible with the invention. Methods for forming an isolation region 412 between photo sensors 401, 403 may include formation of a shallow trench isolation (STI) region, or any other acceptable isolation technique may also be used. These isolation techniques may also be employed to isolate active area portions of the trunks 451, 452 from one another, for isolating active areas from the photo sensors 401, 403, and for isolating one pixel from another. As noted above, acceptable methods of forming conductors 438,441 may include the formation of buried interconnection near a surface of the substrate or metallization wiring in layers above the substrate. If a capacitor 465 is desired, an electrode 408" of this capacitor may be formed, in accordance with a preferred embodiment of the invention, as a gate 432 of a source follower transistor. Capacitor 465, which can be shared among pixel cells, may be alternatively be formed in other locations, for example, it may be formed over a common floating diffusion region 410.

Figure 5:
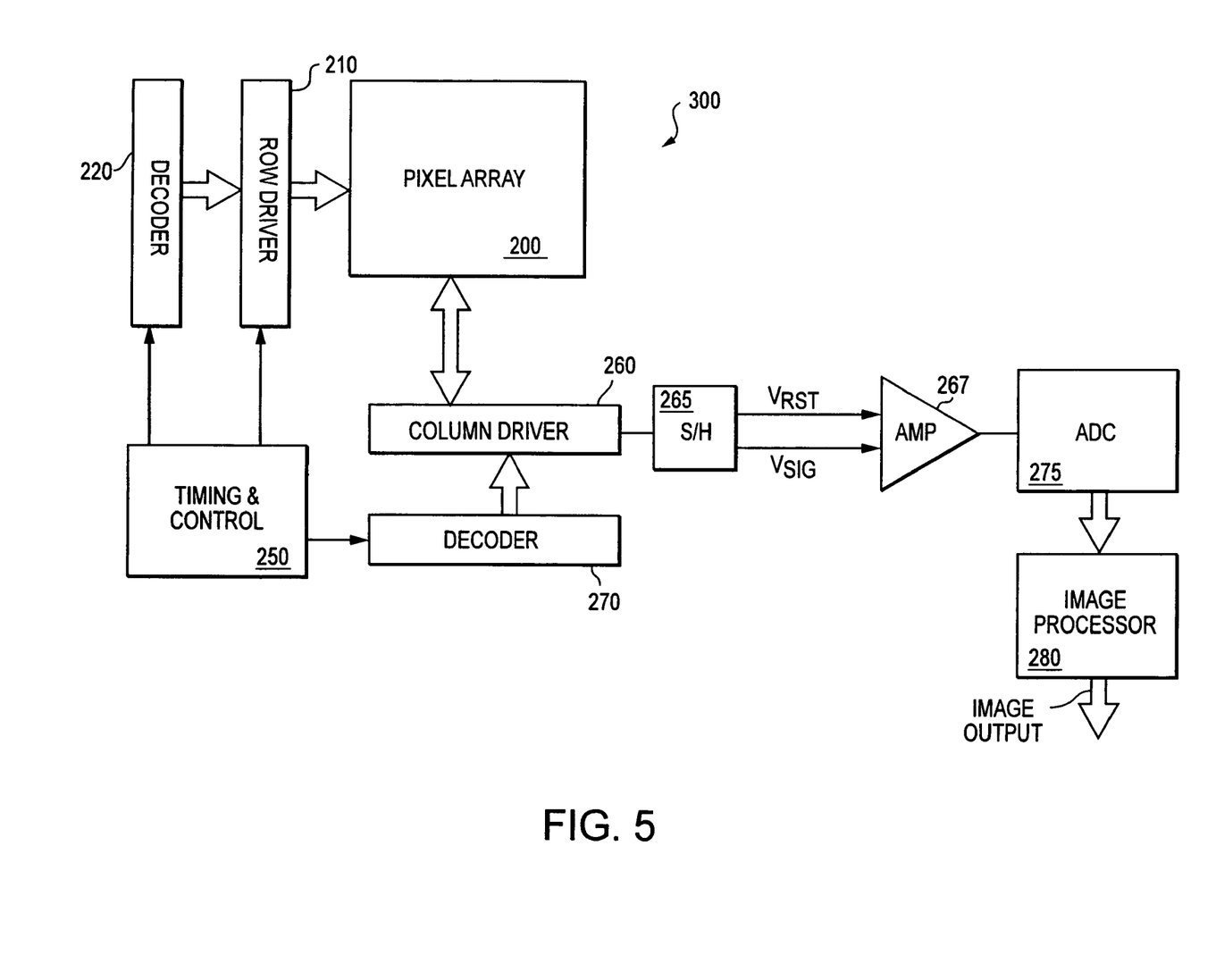
FIG. 5 is a block diagram of a CMOS imager chip having an array of pixel cells constructed in accordance with the invention.

FIG. 5 illustrates a block diagram of an exemplary CMOS imager 300 having a pixel array 200 formed of pixel cells constructed in accordance with a split trunk embodiment described above. Pixel array 200 comprises a plurality of pixels arranged in a predetermined number of columns and rows (not shown). Attached to the array 200 is signal processing circuitry, as described herein. The pixels of each row in array 200 can be simultaneously operated, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel.

The CMOS imager 300 is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$), taken as a pixel output after the floating diffusion region 410 is reset, and a pixel image signal ($V_{sig}$), taken after charges accumulated in the photo sensor are gated to the floating diffusion region 410 by the transfer transistor 405, are read by a sample and hold circuit 265 associated with the column drive 260. A differential signal ($V_{rst}$–$V_{sig}$) is produced by differential amplifier 267 for each pixel. The differential signal is digitized by an analog-to-digital converter 275 (ADC). The analog-to-digital converter 275 supplies the digitized pixel signals to an image processor 280 which forms and outputs a digital image.

Figure 6:
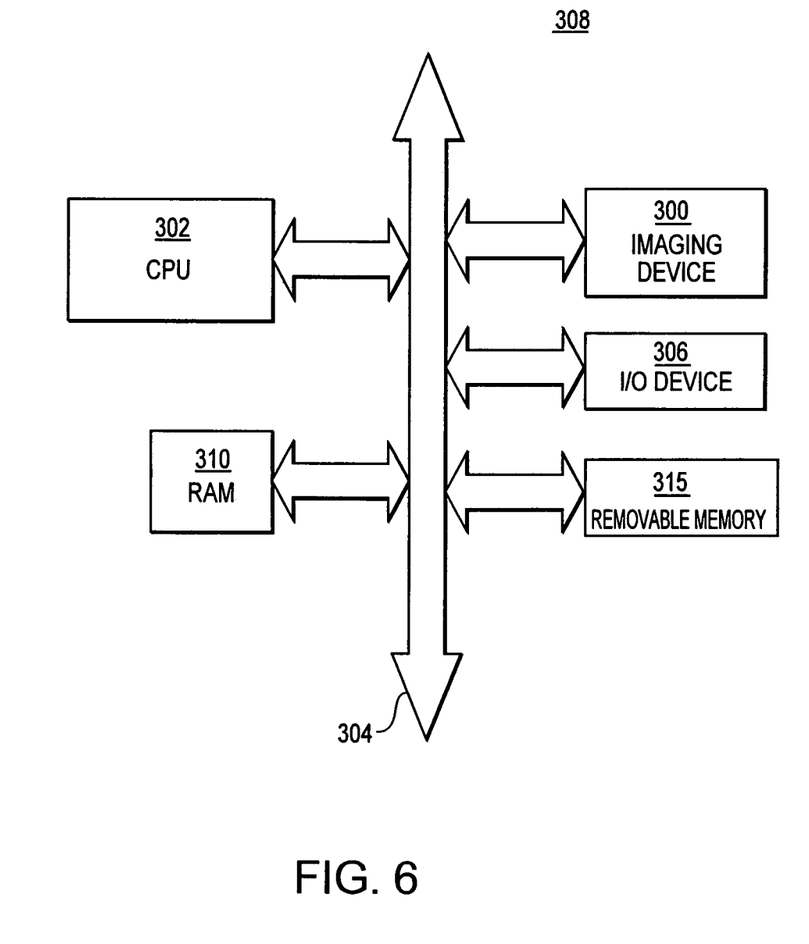
FIG. 6 is a schematic diagram of a processing system employing a CMOS imager constructed in accordance with the invention.

FIG. 6 shows a processor system 308, which includes an imager 300 constructed in accordance with an embodiment of the invention. The processor system 308 may be part of a digital camera or other imaging system. The imager 300 may receive control or other data from system 308. System 308 includes a processor 302 having a central processing unit (CPU) for image processing, or other image handling operations. The processor 302 communicates with various devices over a bus 304. Some of the devices connected to the bus 304 provide communication into and out of the system 308; an input/output (I/O) device 306 and an imaging device, i.e., imager 300, are such communication devices. Other devices connected to the bus 304 provide memory, for instance, a random access memory (RAM) 310 or a removable memory 315.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is discussed only with reference to pixel arrays having a 2-pixel sharing of component parts between column adjacent pixels, other multi-pixel sharing arrays are also intended to be within the scope of the invention, and the split trunk design may be implemented with any pixel cell array. Additionally, any modifications, though presently unforeseeable, of the present invention that come within the spirit and scope of the following claims should be considered part of the present invention.

What is claimed as new and desired to be protected by Letters Patent of the United States is:

1. An imager comprising:
   a first photosensor for generating charges in response to light;
   a first active region comprising first doped regions and at least one transistor gate interconnecting said first doped regions;
   a second active region comprising second doped regions and at least one transistor gate interconnecting said second doped regions, said first doped regions being different than said second doped regions;
   a first transfer transistor having a transfer gate that is operable to transfer the generated charges from the photosensor to a storage node, the transfer gate and storage node being part of said first active region;
   at least one transistor having a gate for receiving charges from said storage node and providing an output signal, said at least one transistor being part of said second active region which is separated from said first active region;
   a reset transistor for resetting said storage node; and
   a row select transistor for gating said output signal, wherein only one of said reset transistor and said row select transistor is located at said second active region, and wherein said gate also comprises a plate for a capacitive element.

2. The imager of claim 1, wherein the at least one transistor comprises a source follower transistor.

3. The imager of claim 1, wherein the gate receives said charges by one of either a buried interconnect or a metallization wiring layer.

4. The imager of claim 1, wherein at least a portion of the transfer gate is located at an angle with respect to the first photosensor.

5. The imager of claim 4, wherein only a side edge of the transfer gate is located at an angle with respect to the first photosensor.

6. The imager of claim 1, further comprising a reset transistor located at said first active region for resetting said storage node.

7. The imager of claim 6, further comprising a row select transistor coupled to gate an output of a source follower transistor, said row select transistor being provided at said second active region.

8. The imager of claim 1, further comprising:
  a second photosensor for generating charges in response to light; and
  a second transfer transistor having a transfer gate for transferring the generated charges from the second photosensor to the storage node.

9. The imager of claim 8, wherein the first and second transfer transistor each have a respective transfer gate.

10. The imager of claim 8, wherein the first active region is located in an area at least partially between the first and second photosensor.

11. The imager of claim 10, wherein the second active region is located in an area adjacent one of the first and the second photosensors.

12. The imager of claim 1, wherein the plate for the capacitive element increases a storage capacity of the storage node.

13. The imager of claim 12, wherein a gate electrode of the at least one transistor and the capacitor plate each comprise the same conductive plate.

14. The imager of claim 1, wherein respective gates of said at least one transistor, reset transistor, and row select transistor are not linearly aligned.

15. A pixel array comprising:
  first and second pixels, the first pixel comprising a first photosensor for generating photocharges in response to light, the second pixel comprising a second photosensor for generating photocharges in response to light;
  a first active region comprising a first and second transfer transistor structure for respectively transferring the photo-charges from the first and second photosensors to a common storage region;
  a second active region, entirely separated from the first active region by a fixed isolation region but electrically connected the first active region, the second active region comprising a source follower transistor for reading out signals from the common storage region;
  a reset transistor for resetting said common storage region; and
  a row select transistor for gating said signals,
  wherein said second active region comprises only one of said reset transistor and said row select transistor, and
  wherein a gate of the source follower transistor forms one plate of a capacitor.

16. The pixel array of claim 15, wherein the first and second transfer transistor structures each have a respective first and second transfer transistor gate.

17. The pixel array of claim 15, wherein the first active region further comprises a reset gate for resetting the common storage region.

18. The pixel array of claim 17, wherein the second active region further comprises a row select transistor coupled to gate an output of a source follower transistor.

19. The pixel array of claim 15, wherein the capacitor plate is electrically connected to the common storage region.

20. The pixel array of claim 15, wherein the first and second pixels are column adjacent pixels.

21. The pixel array of claim 15, wherein the first and second pixels are row adjacent pixels.

22. The pixel array of claim 15, wherein the capacitor plate increases a storage capacity of the common storage region.

23. The pixel array of claim 15, wherein respective gates of said source follower transistor, said reset transistor, and said row select transistor are not linearly aligned.

24. A method of forming a pixel array, the method comprising:
  forming a first active region comprising first doped regions and at least one transistor gate interconnecting said first doped regions;
  forming a second active region comprising second doped regions and at least one transistor gate interconnecting said second doped regions, said first doped regions being different than said second doped regions;
  forming a photosensor in a substrate;
  forming a transfer gate having at least a portion angled with respect to the photosensor, the transfer gate being part of said first active region;
  forming a transistor gate as part of said second active region which is physically separated from the first active region by a fixed isolation region, said transistor gate being electrically connected to said first active region;
  forming a capacitor such that a plate of the capacitor is the transistor gate;
  forming a reset transistor for resetting a storage region; and
  forming a row select transistor for gating signals controlled by said transistor gate,
  wherein only one of said reset transistor and said row select transistor is formed as part of said second active region.

25. The method of claim 24, wherein the act of forming a photosensor comprises forming a photodiode.

26. The method of claim 24, further comprising the act of forming an interconnect
  by forming a buried interconnect near the surface of the substrate to electrically connect said transistor gate to said first active region.

27. The method of claim 24, further comprising the act of forming an interconnect by forming a metallization layer above the surface of the substrate to electrically connect said transistor gate to said first active region.

28. The method of claim 24, wherein the first active region is formed adjacent a first side of the photosensor and wherein the second active region is formed adjacent a second side of the photosensor.

29. The pixel array of claim 24, wherein the capacitor plate increases a storage capacity of the common storage region.

30. The method of claim 24, wherein said transistor gate and respective gates of said reset transistor and said row select transistor are not linearly aligned.

31. A method of forming a pixel cell array comprising a plurality of pixels, the method comprising:
  forming first and second photosensors for generating photo-charges in response to applied light;
  forming a first trunk including a common transfer gate, the transfer gate for transferring the photo-charges from each of the first and second photosensors to a common storage region, wherein the common transfer gate is located at least partially at an angle with respect to each of the first and the second photosensors;

forming a second trunk, split from the first trunk and including at least one transistor for reading out a signal representing the photo-charges transferred to the common storage region;

forming a reset transistor for resetting said common storage region; and forming a row select transistor for generating said signal, wherein respective gates of said at least one transistor, said reset transistor, and said row select transistor are not linearly aligned.

32. The method of claim 31, wherein the at least one transistor comprises a source follower transistor having a gate.

33. The method of claim 31, further comprising the act of forming a capacitive element on the second trunk.

34. The method of claim 31, wherein the act of forming first and second photosensors comprises forming row adjacent photosensors.

35. The method of claim 34, wherein the first trunk is formed in an area above and at least partially between the photosensors.

36. The method of claim 35, wherein the second trunk is formed adjacent one of the first and second photosensors.

37. The method of claim 31, further comprising:
forming a plate of a capacitor and a gate electrode of the at least one transistor from the same conductive layer, wherein the capacitor plate increases the storage capacity of the common storage region.

38. The method of claim 31, wherein said second trunk includes only one of said reset transistor and said row select transistor.

39. A processing system comprising:
a processor; and
an imaging device electrically coupled to said processor, said imaging device comprising a pixel array, said array comprising:
first and second pixels, the first pixel comprising a first photosensor for generating photocharges in response to light, the second pixel comprising a second photosensor for generating photocharges in response to light;
a first active region comprising a common transfer gate, the transfer gate for transferring the photo-charges from the first and second photosensors to a common storage region;
a second active region, split from the first active region, comprising at least one transistor for reading out signals from the common storage region and further comprising a capacitor;
a reset transistor for resetting said common storage region; and
a row select transistor for gating said signals,
wherein respective gates of said at least one transistor, said reset transistor, and said row select transistor are not linearly aligned.

40. The processing system of claim 39, wherein the imaging device comprises a CMOS imaging device.

41. The processing system of claim 39, wherein the first and second pixel cells are row adjacent pixel cells.

42. The processing system of claim 39, wherein the capacitor is in direct electrical communication with the common storage region via an underlying or overlying conductive layer, such that the capacitor increases a storage capacity of the common storage region.

43. The processing system of claim 42, wherein a gate electrode of said at least one transistor and a capacitor plate of the capacitor overlap one another from a top-down view of said substrate.

44. The processing system of claim 39, wherein said second active region comprises only one of said reset transistor and said row select transistor.

45. An imaging device comprising an array of pixel cells, the array comprising: a first pair of pixels comprising:
a first and second photosensor for generating photo-charges;
first and second transfer transistors for respectively transferring the photo-charges from said first and second photosensors to a storage node;
a first active area located at least partially between the first and second photosensors;
a second active area, that is physically separated from but electrically connected to the first active area, wherein the second active area comprises a capacitor for the pair of pixels;
a source follower transistor for reading out a signal indicating an amount of said photo-charges at said storage node;
a reset transistor for resetting said storage node; and
a row select transistor for gating said signal,
wherein respective gates of said source follower transistor, said reset transistor, and said row select transistor are not linearly aligned.

46. The imaging device of claim 45, wherein the second active area is located between the first and a second pair of pixels in the array.

47. The imaging device of claim 45, wherein a plate for the capacitor comprises a gate of a source follower transistor.

48. The imaging device of claim 45, wherein the first and second transfer transistors comprise respective first and second transfer transistor gates, each of the first and second transfer gates being located at least partially at an angle with respect to the first and second photosensors.

49. The imaging device of claim 45, wherein the second active area comprises at
least one transistor having a gate stack, and said gate stack comprises a capacitor plate for
increasing a storage capacity of the storage node.

50. The imaging device of claim 45, wherein respective gates of said at source follower transistor, said reset transistor, and said row select transistor are not linearly aligned.

51. An imager comprising:
a first photosensor for generating charges in response to light;
a first transfer transistor having a transfer gate for transferring the generated charges from
the photosensor to a floating diffusion region;
a first readout circuit trunk comprising first doped regions and at least one transistor gate interconnecting said first doped regions, said first readout circuit trunk comprising the storage node and a reset transistor for driving the floating diffusion region to a reset voltage; and
a second readout circuit trunk comprising second doped regions and at least one transistor gate interconnecting said second doped regions, said second readout circuit trunk comprising a source follower transistor for outputting a signal indicating an amount of charge stored by the floating diffusion region,
wherein said first doped regions are different than said second doped regions.

52. The imager of claim 51, wherein the second trunk further comprises a capacitor plate for increasing a storage capacity of the floating diffusion region.

53. The imager of claim 52, wherein the second readout circuit trunk further comprises a row select transistor for gating the signal output by the source follower transistor.

54. The imager of claim 52, wherein the capacitor plate and a gate region of the source follower transistor are overlapping.

55. The imager of claim 52, wherein the capacitor plate and a gate electrode of the source follower transistor are integrally formed of the same conductive layer.

56. The imager of claim 51, wherein respective gates of said at source follower transistor, said reset transistor, and said row select transistor are not linearly aligned.

* * * * *